(12) United States Patent
Tanaka

(10) Patent No.: US 9,373,372 B2
(45) Date of Patent: Jun. 21, 2016

(54) REGISTER FILE DEVICE

(71) Applicant: FUJITSU LIMITED, Kawasaki-shi, Kanagawa (JP)

(72) Inventor: Tomohiro Tanaka, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 190 days.

(21) Appl. No.: 14/167,077

(22) Filed: Jan. 29, 2014

(65) Prior Publication Data

US 2014/0281285 A1    Sep. 18, 2014

(30) Foreign Application Priority Data

Mar. 18, 2013   (JP) ................................. 2013-055711

(51) Int. Cl.
*G11C 8/16* (2006.01)
*G11C 7/10* (2006.01)
*G11C 7/22* (2006.01)

(52) U.S. Cl.
CPC ............ *G11C 7/1075* (2013.01); *G11C 7/1063* (2013.01); *G11C 7/222* (2013.01)

(58) Field of Classification Search
CPC ...... G11C 7/1075; G11C 8/16; G11C 11/412; G06F 13/1657; G06F 12/18
USPC ..................... 711/149; 365/230.05
See application file for complete search history.

(56) References Cited

U.S. PATENT DOCUMENTS

| | | | |
|---|---|---|---|
| 7,363,436 B1 * | 4/2008 | Yeh | G06F 13/1605 711/149 |
| 7,836,435 B2 * | 11/2010 | Zhang | G06F 11/073 717/135 |
| 2006/0256641 A1 | 11/2006 | Johnstone | |
| 2009/0129194 A1 * | 5/2009 | New | G11C 8/16 365/230.05 |
| 2014/0177324 A1 * | 6/2014 | Liu | G11C 8/16 365/154 |

FOREIGN PATENT DOCUMENTS

| | | |
|---|---|---|
| JP | 2003-91992 | 3/2003 |
| JP | 2007-18501 | 1/2007 |
| WO | WO 01/67271 A1 | 9/2001 |

* cited by examiner

*Primary Examiner* — Adam M Queler
*Assistant Examiner* — Edmund Kwong
(74) *Attorney, Agent, or Firm* — Staas & Halsey LLP

(57) ABSTRACT

A register file device includes: a multi-port latch; and a write circuit that generates a signal to be written in the multi-port latch, the write circuit generating the signal on the basis of a plurality of data groups each including a write control signal, a write address, and a piece of write data, wherein the write circuit includes: a detection circuit that detects at least two write control signals occurred simultaneously among write control signals, and a changing circuit that changes write data corresponding to one of the write control signal to become same as write data corresponding to another of the write control signal.

7 Claims, 10 Drawing Sheets

REGISTER FILE DEVICE

CROSS-REFERENCE TO RELATED APPLICATION

This application is based upon and claims the benefit of priority from the prior Japanese Patent Application No. 2013-055711 filed on Mar. 18, 2013, the entire contents of which are incorporated herein by reference.

FIELD

The embodiments discussed herein are related to a register file device.

BACKGROUND

A multi-port latch is a storage element that selects one piece of write data from a plurality of pieces of write data and stores the selected write data. A widely known dual port memory is a memory that selects one piece of write data from two pieces of write data and stores the selected write data.

There is limitation that a plurality pieces of write data are not allowed to be selected at the same time and written in the multi-port latch. When the plurality pieces of write data are selected at the same time and written in the multi-port latch, bus fight (short circuit) may occur in a storage unit. When the bus fight occurs, a value to be stored is not determined, and there occurs a problem that large current flows into the storage unit and breaks down a semiconductor device in the storage unit at worst. The occurrence of one signal that is used to select data to be written is referred to as one hot, and the occurrence of a plurality of signals that are used to select data to be written at the same time is referred to multi-hot.

A register file device in which the multi-port latch is used is controlled so that multi-hot does not occur. Therefore, the occurrence of multi-hot means that an error has occurred in the device, and it is desirable to execute some recovery processing, and recovery processing to be executed is set as appropriate.

In addition, when multi-hot occurs, bus fight occurs in the multi-port latch, and the semiconductor device of the storage unit may be broken down. When the semiconductor device is broken down, the multi-port latch becomes unrecoverable and is not allowed to be used thereafter. In order to avoid such a situation, it has been proposed measures for avoiding the occurrence of bus fight are taken for write signals of the multi-port latch in the register file device.

In one of the proposed measures, a priority adjustment circuit is provided that adjusts priority of write control signals in a unit of access of the multi-port latch, for example, in a unit of word of the multi-port latch to prohibit multi-hot so that one data selection signal is merely output once. However, in such a measure, the priority adjustment circuit is provided for each word in the multi-port latch, so that there is a problem that the footprint is increased undesirably. In addition, the priority adjustment circuit is provided at the downstream of a decoder circuit of an address for accessing the multi-port latch, so that there is a problem that delay of a write path is increased, and the operation speed becomes slow.

In the other measure, a 1-hot guarantee circuit is provided that checks whether address values for accessing the multi-port latch are matched to each other and stops decoding of the corresponding address when the address values are matched to each other, to guarantee that 1-hot or less occurs. In the other measure, the single 1-hot guarantee circuit is provided in the register file device, so that an increase in the footprint is suppressed. However, the 1-hot guarantee circuit is provided at the upstream of a decoder circuit of an address for accessing the multi-port latch, and an operation of the decoder circuit is controlled depending on the result that is obtained in the 1-hot guarantee circuit, so that there is a problem that delay of the write path is increased, and the operation speed becomes slow.

The following is reference documents:
[Document 1] Japanese Laid-open Patent Publication No. 2007-018501 and
[Document 2] Japanese Laid-open Patent Publication No. 2003-091992.

SUMMARY

According to an aspect of the invention, a register file device includes: a data storage circuit that includes a multi-port latch; and a write circuit that generates a signal to be written in the data storage circuit, the write circuit generating the signal on the basis of a clock signal, a plurality of data groups each including a write control signal, a write address, and a piece of write data, wherein the write circuit includes: an address match detection circuit that detects whether at least two write addresses are matched to each other, and outputs an address match signal for the matched address, and a changing circuit that changes pieces of write data of the matched addresses to an identical piece of data upon receiving the address match signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
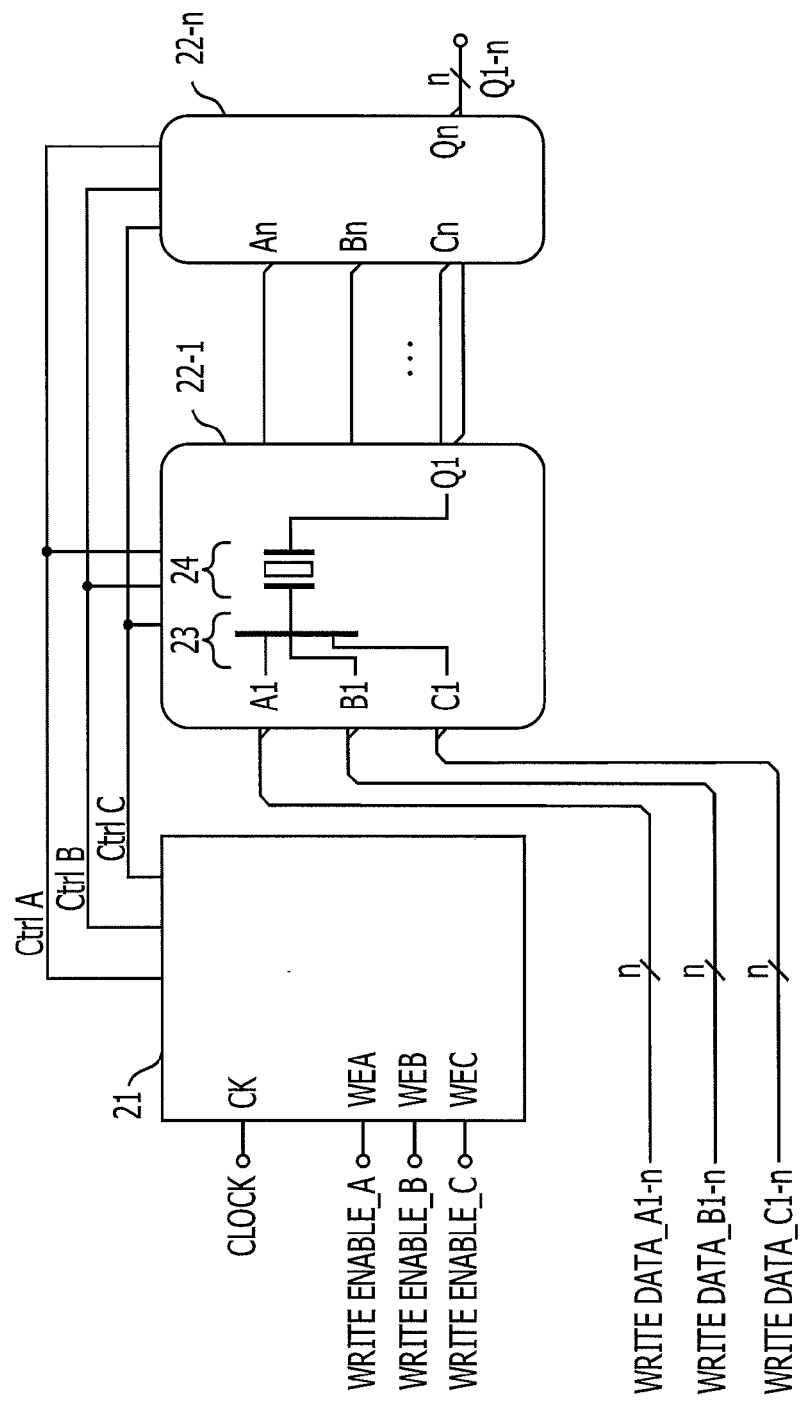
FIG. 1 is a diagram illustrating a schematic structure of a 3-input n-bit multi-port latch.

FIG. 1 is a diagram illustrating a schematic structure of a 3-input n-bit multi-port latch. The multi-port latch includes a clock control unit 21 and n storage units 22-1 to 22-n. The multi-port latch in FIG. 1 is a latch in which the n storage units are connected to the single clock control unit 21, which configures an n-bit storage unit as a whole.

The clock control unit 21 receives a clock signal "Clock" at a "CK" port and receives 3-input write signals "WriteEnable_A", "WrireEnable_B", and "WriteEnable_C" as "WEA" to "WEC". The clock control unit 21 generates three write control signals "CtrlA", "CtrlB", and "CtrlC" that are supplied to the storage units 22-1 to 22-n, from "CK" and "WEA" to "WEC".

The storage units 22-1 to 22-n have the same structure. Bit signals of 1 to n of three write data signals "WriteData_A1-n", "WriteData_B1-n", and "WriteData_C1-n" are respectively supplied to the n storage units 22-1 to 22-n. Therefore, each of the storage units receives 1-bit write signals of the three write data signals.

For example, the storage unit 22-1 includes a selection unit 23 and a latch unit 24. The selection unit 23 selects one piece of write data to be stored from the three pieces of write data A1, B1, and C1 on the basis of the write control signals "CtrlA", "CtrlB", and "CtrlC", and supplies the selected write data to the latch unit 24. The latch unit 24 holds the selected data as an output Q1. That is, writing of the selected data is performed on the latch unit 24.

There is limitation that a plurality of pieces of data is not allowed to be selected at the same time in data selection of the selection unit 23 in the multi-port latch. In the multi-port latch in FIG. 1, the signals "WEA" to "WEC" that are used to select data to be written from the three ports are not allowed to instruct a plurality of pieces of data to be written at the same time. Therefore, the write control signals "CtrlA", "CtrlB", and "CtrlC" are not to be signals that are used to select a plurality of pieces of write data in the selection unit 23. That is, these signals are to be signals that are limited so that 1-hot or less occurs. If "CK" is input in a state in which the signals "WEA" to "WEC" select two or more of pieces of write data, bus fight (short circuit) may occur in the storage unit. In that case, a value to be stored is not determined, and large current flows into the storage unit and breaks down the semiconductor device of the storage unit at worst.

Figure 2:
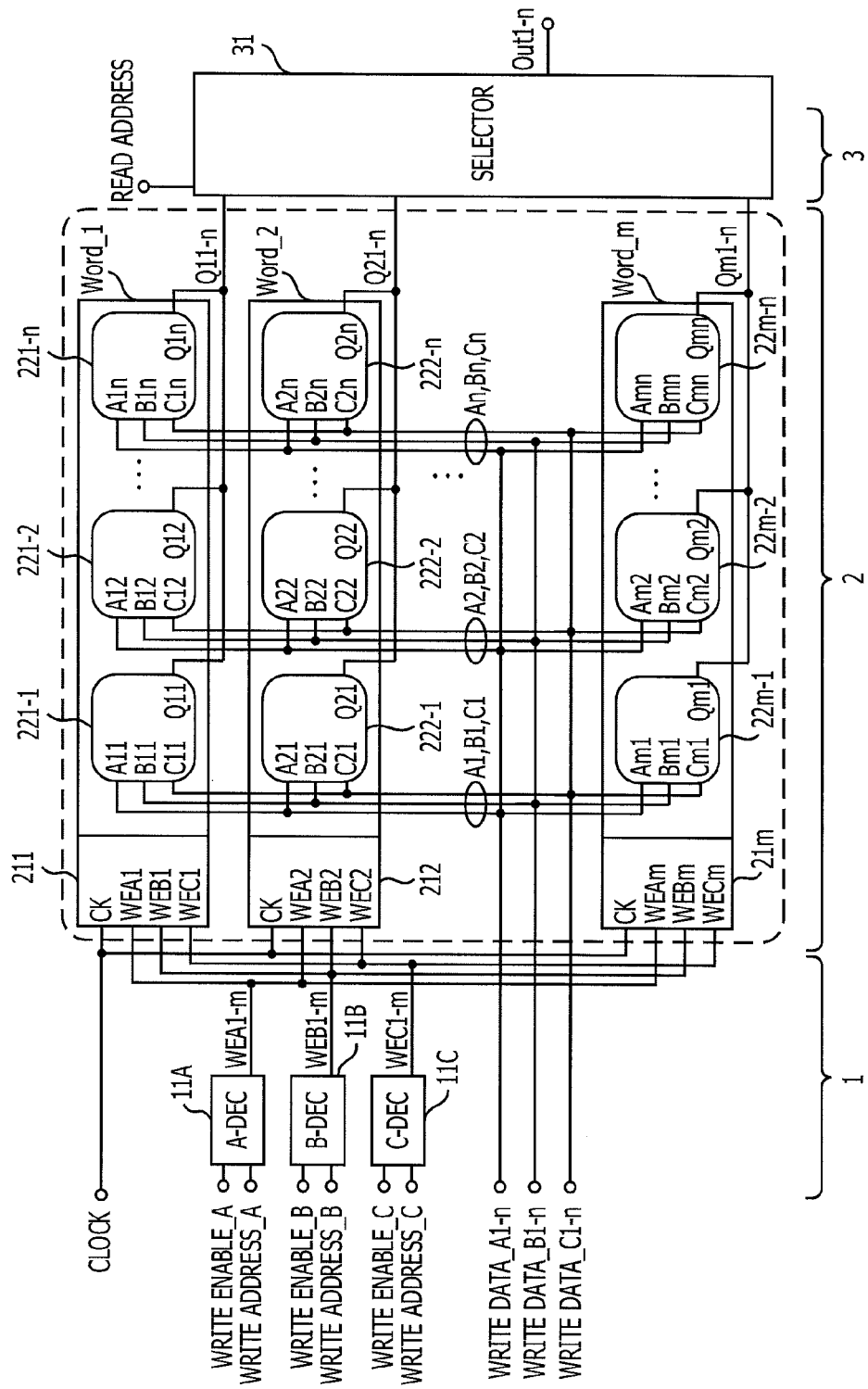
FIG. 2 is a diagram illustrating a schematic structure of a register file device in which the multi-port latch is used.

A register file device in which such a multi-port latch is used is described below. FIG. 2 is a diagram illustrating a schematic structure of a register file device in which the multi-port latch is used. The register file device in FIG. 2 is a 3-ports input register file device that stores n-bit data for m addresses.

The register file device includes a write unit 1, a data storage unit 2, and a read unit 3. The data storage unit 2 includes a data latch circuit 20 that is constituted by 3-port latches "Word_1" to "Word_m". That is, the data storage unit 2 has a structure in which the m multi-port latches in FIG. 1 are arranged. Therefore, the 3-port latches "Word_1" to "Word_m" respectively include clock control units 211 to 21m, and n storage units 221-1 to 221-n, n storage units 222-1 to 222-n, . . . , and n storage units 22m-1 to 22m-n.

The write unit 1 controls to write three pieces of "WriteData_A1-n", "WriteData_B1-n", and "WriteData_C1-n" to a 3-port latch that is specified by "WriteAddress_A", "WriteAddress_B", and "WriteAddress_C". In order to perform such control, the write unit 1 includes decoders "A-DEC11A", "B-DEC11B", and "C-DEC11C" that respectively decode "WriteAddress_A", "WriteAddress_B", and "WriteAddress_C". The decoders "A-DEC11A", "B-DEC11B", and "C-DEC11C" respectively generates write signals "WEA1-m", "WEAB1-m", and "WEC1-m" and supplies the generated write signals to the clock control units 211 to 21m of the 3-port latches "Word_1" to "Word_m". One of the write signals "WEA1-m", "WEAB1-m", and "WEC1-m" is merely active.

In the 3-port latches "Word_1" to "Word_m", the 3-port latch to which the WEA1-m, WEAB1-m, or WEC1-m that is active is supplied performs latching of write data from a port that corresponds to the active one of the WEA1-m, WEB1-m, and WEC1-m. The read unit 3 includes a selector 31 that selects data of word that is specified by a Read Address and reads the data.

As described above, in the register file device in FIG. 2, when writing occurs in a plurality of ports in the same 3-port latch at the same time, bus fight occurs in the 3-port latch undesirably. For example, when both of "WriteAddress_A" and "WriteAddress_B" specify "Word_x", and input of the clock signal "Clock" is performed in a state in which the signals "WriteEnable_A" and "WriteEnable_B" are valid, bus fight occurs between "WriteData_A1-n" and "WriteData_B1-n" in the multi-port latch of "Word_x".

As described above, the register file device in which the multi-port latch is used is controlled so that multi-hot does not occur. However, there is a case in which multi-hot occurs for some reason. The occurrence of multi-hot means that an error occurs in the device, and a normal operation is not continued at this point. Therefore, when the occurrence of multi-hot is detected, some recovery processing is executed, and recovery processing to be executed is set as appropriate. For example, the register file device is initialized and processing that has been interrupted is executed again, or the flow returns to a stage in which it is certain that an error has not occurred and the processing is executed again at that point. However, when large current flows into the storage unit and breaks down the semiconductor device due to the occurrence of bus fight, such recovery processing is not allowed to be executed, and it is desirable that repairing of hardware such as replacement of the register file device is performed.

As described above, there is also a problem that the occurrence of bus fight is not avoided in the register file device in FIG. 2, and it has been desired that measures for avoiding bus fight are taken in the register file device.

Figure 3:
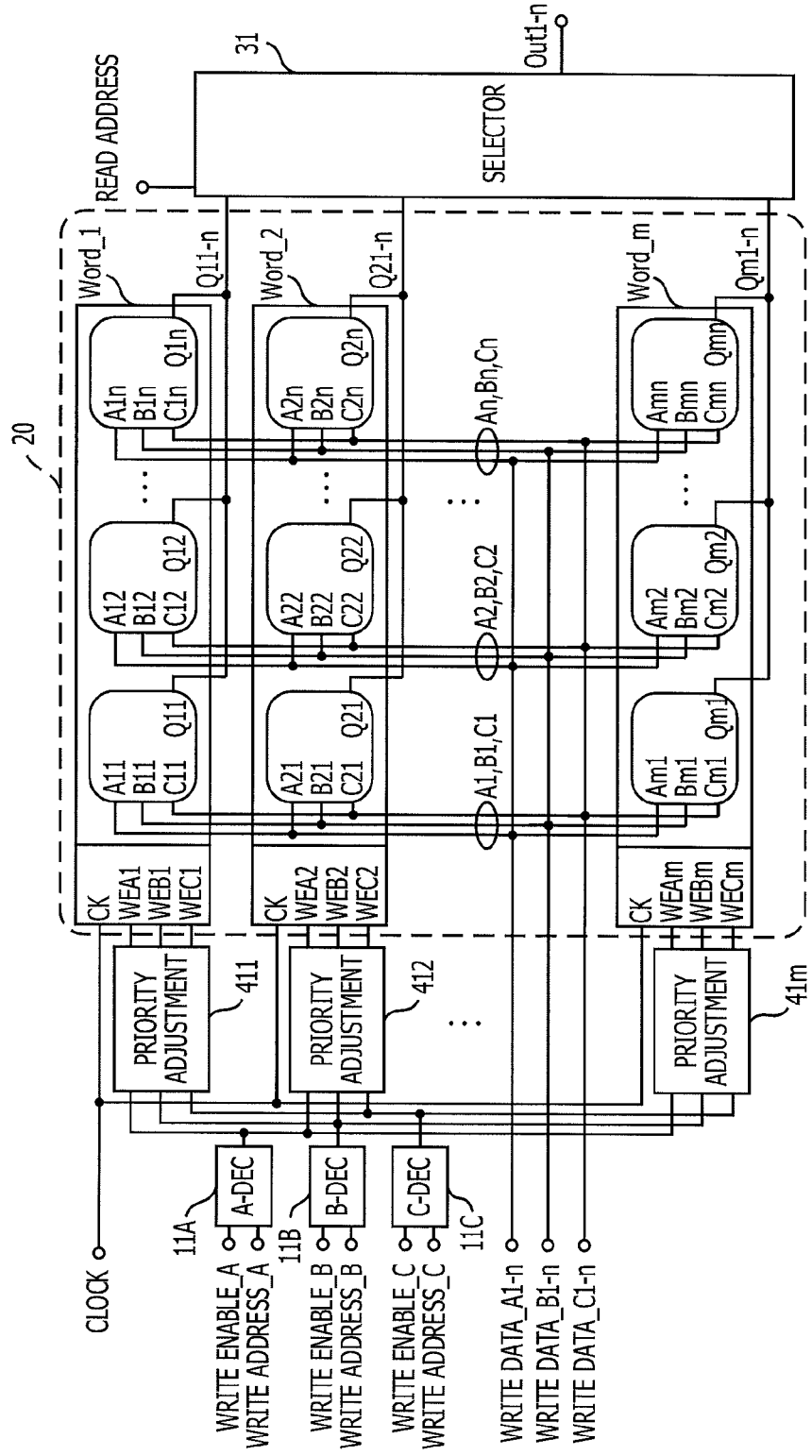
FIG. 3 is a diagram illustrating an example of a register file device to which one measure for avoiding bus fight is applied.

FIG. 3 is a diagram illustrating an example of a register file device to which one measure for avoiding bus fight is applied. The measure illustrated in FIG. 3 is a method of prohibiting multi-selection (multi-hot) in a unit of word (multi-port latch).

As illustrated in FIG. 3, priority adjustment circuits 411 to 41m each of which adjusts priority of write control signals are respectively provided in "Word_1" to "Word_m" that are included in the data latch circuit 20 of the register file device. Such priority adjustment circuits 411 to 41m function as multi-hot prohibition units that prohibit multi-hot of data selection signals in the multi-port latch ("WEA1", "WEB1", and "WEC1" in "Word_1").

In the register file device in which the bus fight avoidance measure is taken, which is illustrated in FIG. 3, the priority adjustment circuit is provided in each of the multi-port latches "Word_1" to "Word_m", so that there is a problem that the footprint is increased. In addition, the priority adjustment circuit is provided at the downstream of each of the decoders "A-DEC11A", "B-DEC11B", and "C-DEC11C", so that there is also a problem that, delay of a delay critical path from the signals "WriteAddress" and "WriteEnable", which determines the delay of the operation is deteriorated.

Figure 4:
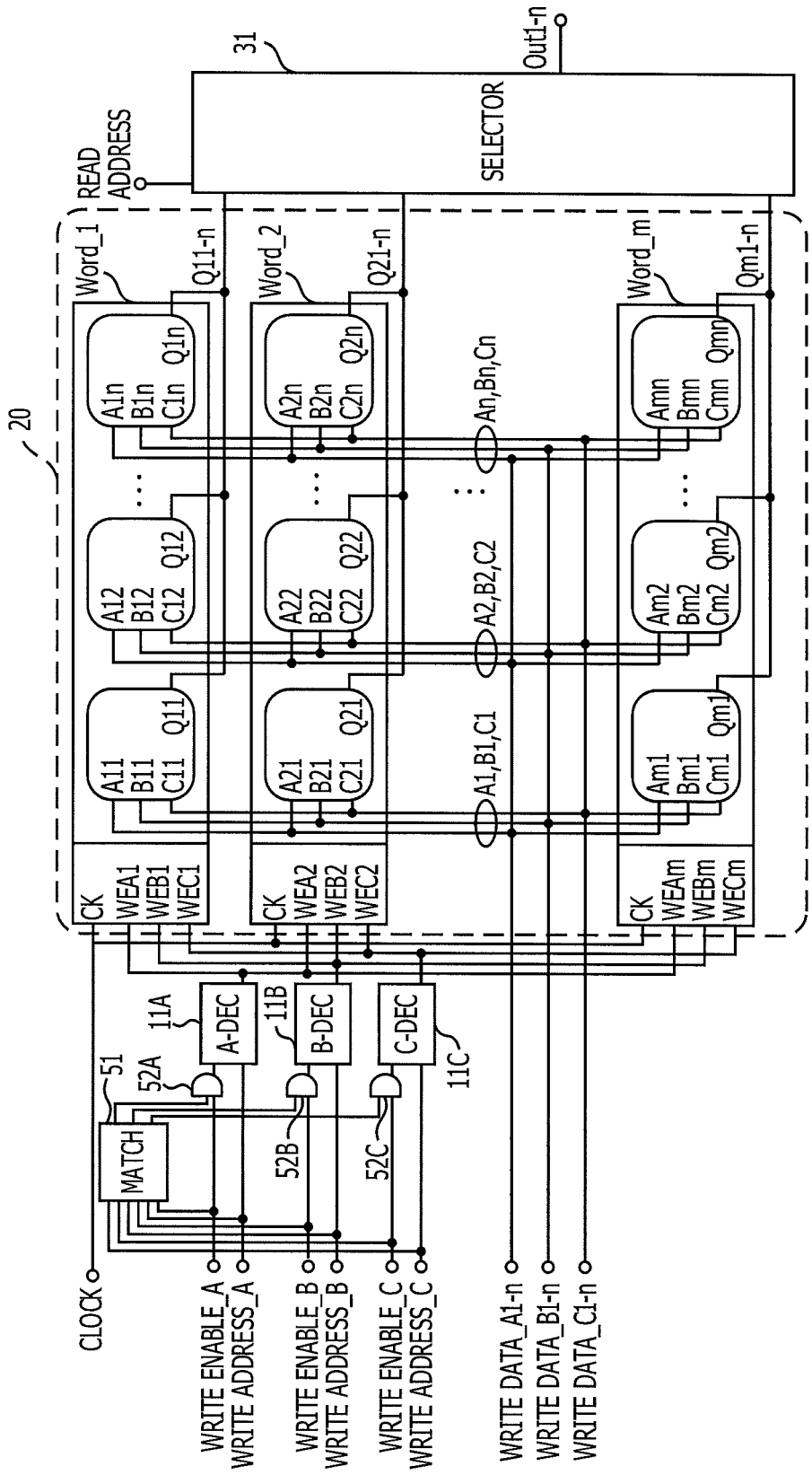
FIG. 4 is a diagram illustrating an example of a register file device to which a further measure for avoiding bus fight is applied.

FIG. 4 is a diagram illustrating an example of a register file device to which a further measure for avoiding bus fight is applied. The measure illustrated in FIG. 4 corresponds to a method of checking whether address values for accessing the multi-port latch are matched to each other and guaranteeing that 1-hot or less occurs by providing the 1-hot guarantee circuit that stops decoding of the corresponding address when the address values are matched to each other.

The register file device in which the bus fight avoidance measure is taken, which is illustrated in FIG. 4, includes an address match detection circuit (Match) 51 and three AND gates 52A to 42C as a 1-hot guarantee unit. In a state in which two or more of "WriteAddress_A" to "WriteAddress_C" are valid, that is, when the corresponding two or more of "WriteEnable_A" to "WriteEnable_C" are valid (H), the address match detection circuit 51 detects whether the values are same. When two or more of "WriteAddress_A" to "WriteAddress_C" are valid, and the values are same, bus fight may occur in a S-port latch that corresponds to the value. Therefore, when the values of "WriteAddress_A" to "WriteAddress_C" are matched to each other, the corresponding "WriteEnable" is stopped by the three AND gate 52A to 42C not to perform decoding in the corresponding decoder. Therefore, it is guaranteed that 1-hot or less occurs in data selection signals ("WEA1", "WEB1", and "WEC1" in "Word_1") of the multi-port latch.

In the register file device in which the bus fight avoidance measure is taken, which is illustrated in FIG. 4, the single 1-hot guarantee unit is merely provided in the device, so that an increase in the footprint is suppressed. However, the 1-hot guarantee unit is provided at the upstream of the decoders "A-DEC11A", "B-DEC11B", and "C-DEC11C", so that there is a problem that delay of the delay critical path from "WriteAddress" and "WriteEnable" is deteriorated.

A register file device according to an embodiment, which is described below, takes a bus fight avoidance measure for achieving both of suppression of "increase in a footprint" and reduction of "deterioration of the path delay".

Here, there are two matters to be noticed. The first matter is that a path from control system signals such as "WriteAddress" and "WriteEnable" is generally delay critical, and a path of "WriteData" is not delay critical when writing in the register file device is performed. The second matter is a problem that a short circuit between data lines occurs due to bus fight in the multi-port latch.

In the register file device according to the embodiment, in terms of the above-described two matters, when two or more of "WriteAddress_A" to "WriteAddress_C" are valid, and the values are same, the corresponding pieces of write data forcibly become the same value. The values of the pieces of data are the same, so that bus fight does not occur, and a short circuit between data lines does not occur. In addition, the processing of causing the corresponding pieces of write data to forcibly become the same value is executed in a path of "WriteData", which is not delay critical, so that delay due to delay critical path is not increased.

In addition, when multi-hot occurs, it is conceivable that an error occurs in the operation, and data values that are written to the register file device are not normal values, and there is no problem even when the pieces of write data are forcibly caused to become the same value. Therefore, the same value may be any value, and for example, the same value may be one of the pieces of write data, or "0 (Low)" or "1 (High)".

Figure 5:
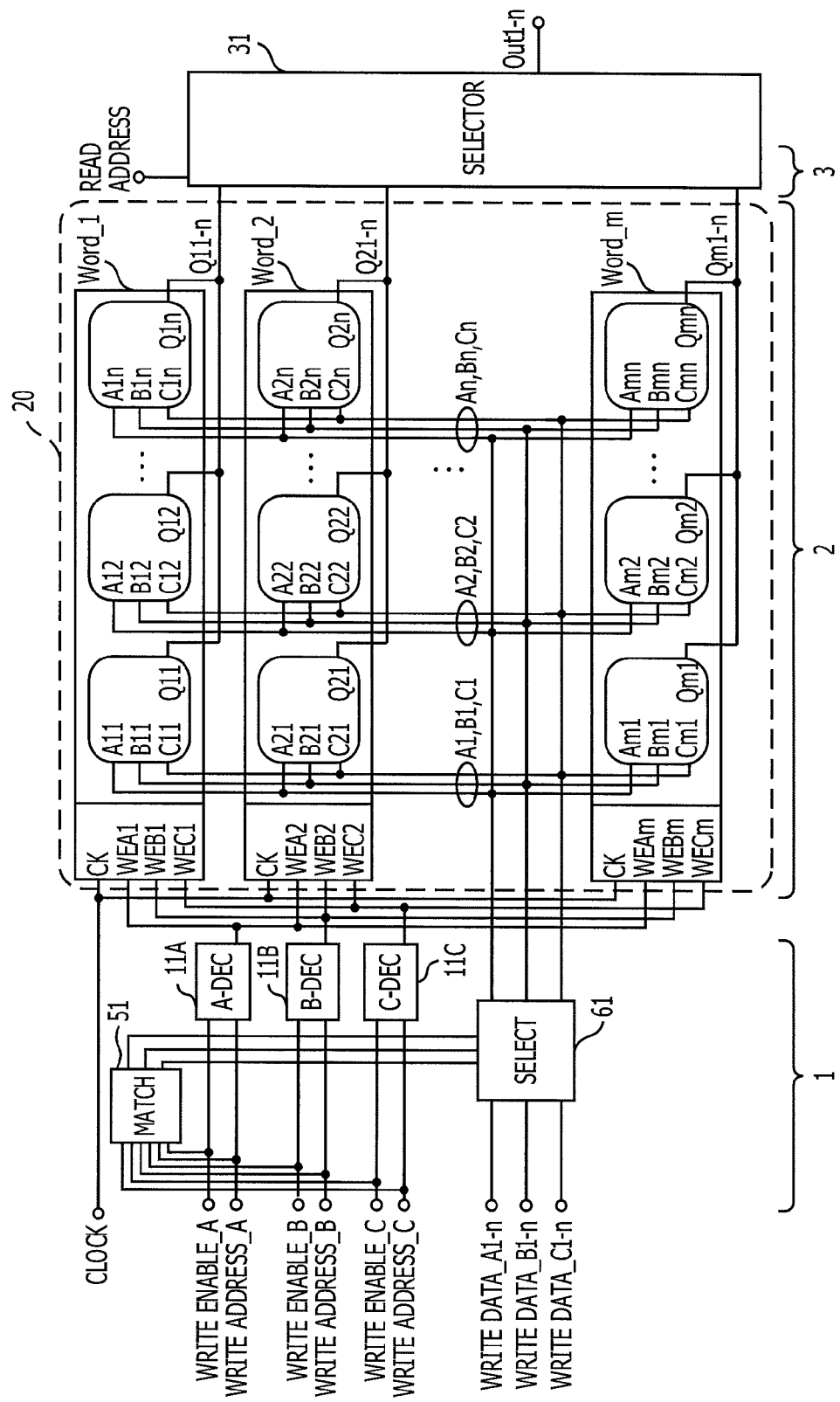
FIG. 5 is a diagram illustrating a schematic structure of a register file device according to an embodiment.

FIG. 5 is a diagram illustrating a schematic structure of a register file device according to an embodiment. The register file device according to the embodiment is a 3-ports input register file device that stores n-bit data for m addresses.

The register file device according to the embodiment includes a write unit 1, a data storage unit 2, and a read unit 3.

The data storage unit 2 includes 3-port latches "Word_1" to "Word_m". That is, the data storage unit 2 has a structure in which m n-bit multi-port latches are arranged. Therefore, the 3-port latches "Word_1" to "Word_m" respectively include clock control units 211 to 21m, and n storage units 221-1 to 221-n, n storage units 222-1 to 222-n, ..., and n storage units 22m-1 to 22m-n.

Figure 6:
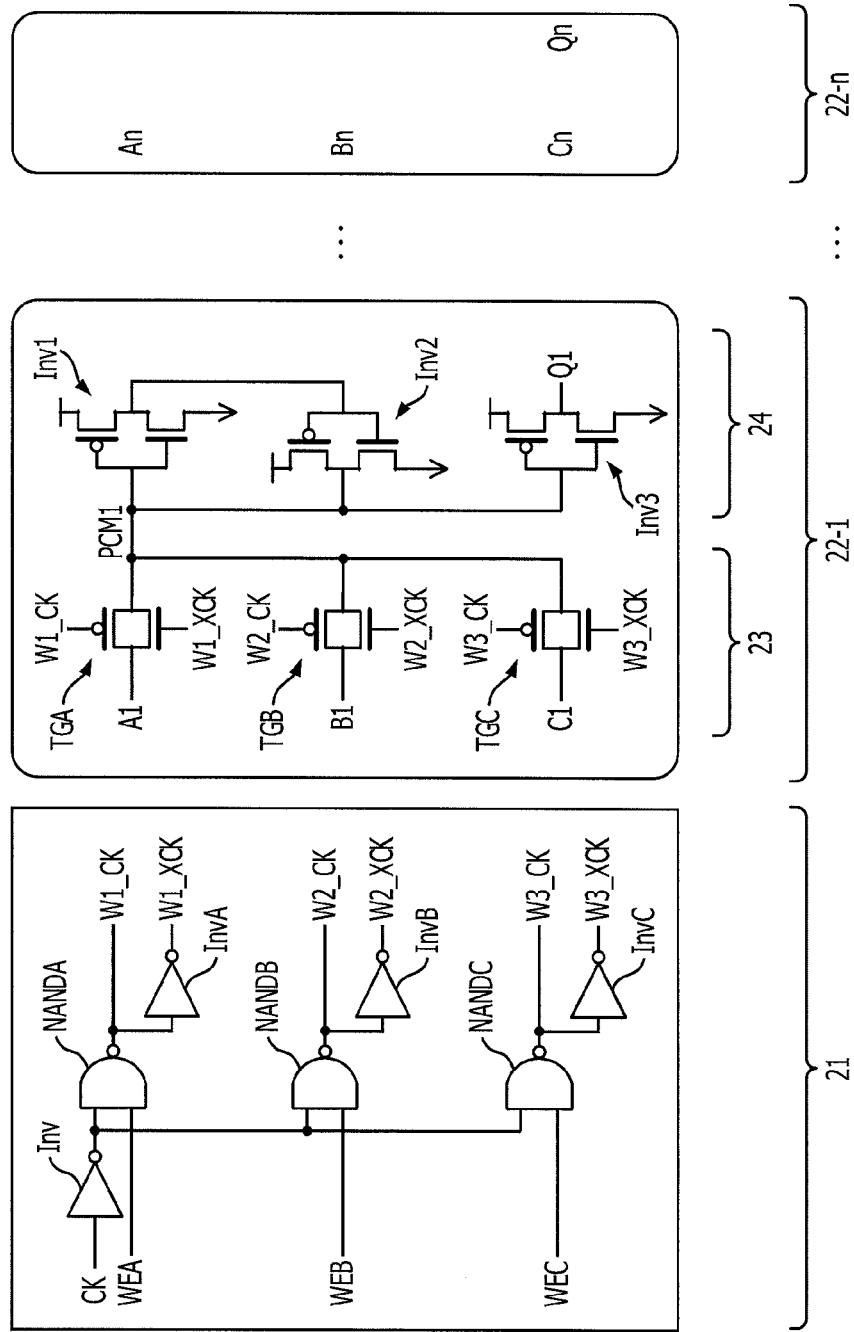
FIG. 6 is a diagram illustrating a structure of the single multi-port latch.

FIG. 6 is a diagram illustrating a structure of the single multi-port latch. The multi-port latch includes a clock control unit 21 and n storage units 22-1 to 22-n.

The clock control unit 21 includes four inverters and three NAND gates, and generates write control signals "W1_CK", "W1_XCK", "W2_CK", "W2_XCK", "W3_CK", and "W3_XCK" from "CK", "WEA", "WEB", and "WEC". "W1_CK" and "W1_XCK" correspond to the signal CtrlA in FIG. 1, "W2_CK" and "W2_XCK" correspond to the signal CtrlB in FIG. 1, and "W3_CK" and "W3_XCK" correspond to the signal CtrlC in FIG. 1. The storage units 22-1 to 22-n has the same structure. The storage unit 22-1 includes a selection unit 23 and a latch unit 24.

The selection unit 23 includes three transfer gates TGA to TGC. In the transfer gate TGA, a passing state is controlled by "W1_CK" and "W1_XCK" using "A1" of write data "WriteData_A1-n" as an input. For example, when "W1_CK=0" and "W1_XCK=1" are satisfied, that is, when "WEA=High" and "CK=Low" are satisfied, output of "A1" is performed, and when the other cases occur, an output becomes high impedance (Hi-Z). The same case is applied to the other transfer gates TGB and TGC.

The latch unit 24 includes three inverters Inv1 to Inv3. The two inverters Inv1 and Inv2 constitute a latch circuit and latches data PCM1 that is obtained by combining outputs of the three transfer gates TGA to TGC. The inverter Inv3 inverts the latched data PCM1 and outputs the inverted data PCM1 as an output Q1.

Returning to FIG. 5, the read unit 3 includes a selector 31 that selects data of word that is specified by a Read Address and performs reading of the data of word. As described above, the data storage unit 2 and the read unit 3 are similar to those of the register file device illustrated in FIG. 2.

The write unit 1 includes decoders "A-DEC11A", "B-DEC11B", and "C-DEC11C", an address match detection circuit (Match) 51, and a changing circuit (Select) 61. The decoders "A-DEC11A", "B-DEC11B", and "C-DEC11C" respectively generate the write signals "WEA1-m", "WEAB1-m", and "WEC1-m", and supply the write signals to the clock control units 211 to 21m of the 3-port latches "Word_1" to "Word_m".

In the state in which two or more of "WriteAddress_A" to "WriteAddress_C" are valid, that is, when the corresponding two or more of "WriteEnable_A" to "WriteEnable_C" are valid (H), the address match detection circuit 51 detects whether the values are same. Therefore, the address match detection circuit 51 in FIG. 5 is similar to that of FIG. 4.

When the two or more of "WriteAddress_A" to "WriteAddress_C" are matched to each other in the state in which two or more of the WriteAddress_A to WriteAddress_C are valid, the changing circuit 61 causes the corresponding pieces of write data to forcibly become the same value. For example, when "WriteAddress_A" and "WriteAddress_B" are matched to each other, "WriteData_B" is changed to "WriteData_A", and when "WriteAddress_A" and "WriteAddress_C" are matched to each other, "WriteData_C" is changed to "WriteData_A". In addition, when "WriteAddress_B" and "WriteAddress_C" are matched to each other, "WriteData_C" is changed to "WriteData_B". In addition, when "WriteAddress_A", "WriteAddress_B", and "WriteAddress_C" are matched to each other, "WriteData_B" and "WriteData_C" are changed to "WriteData_A".

Figure 7:
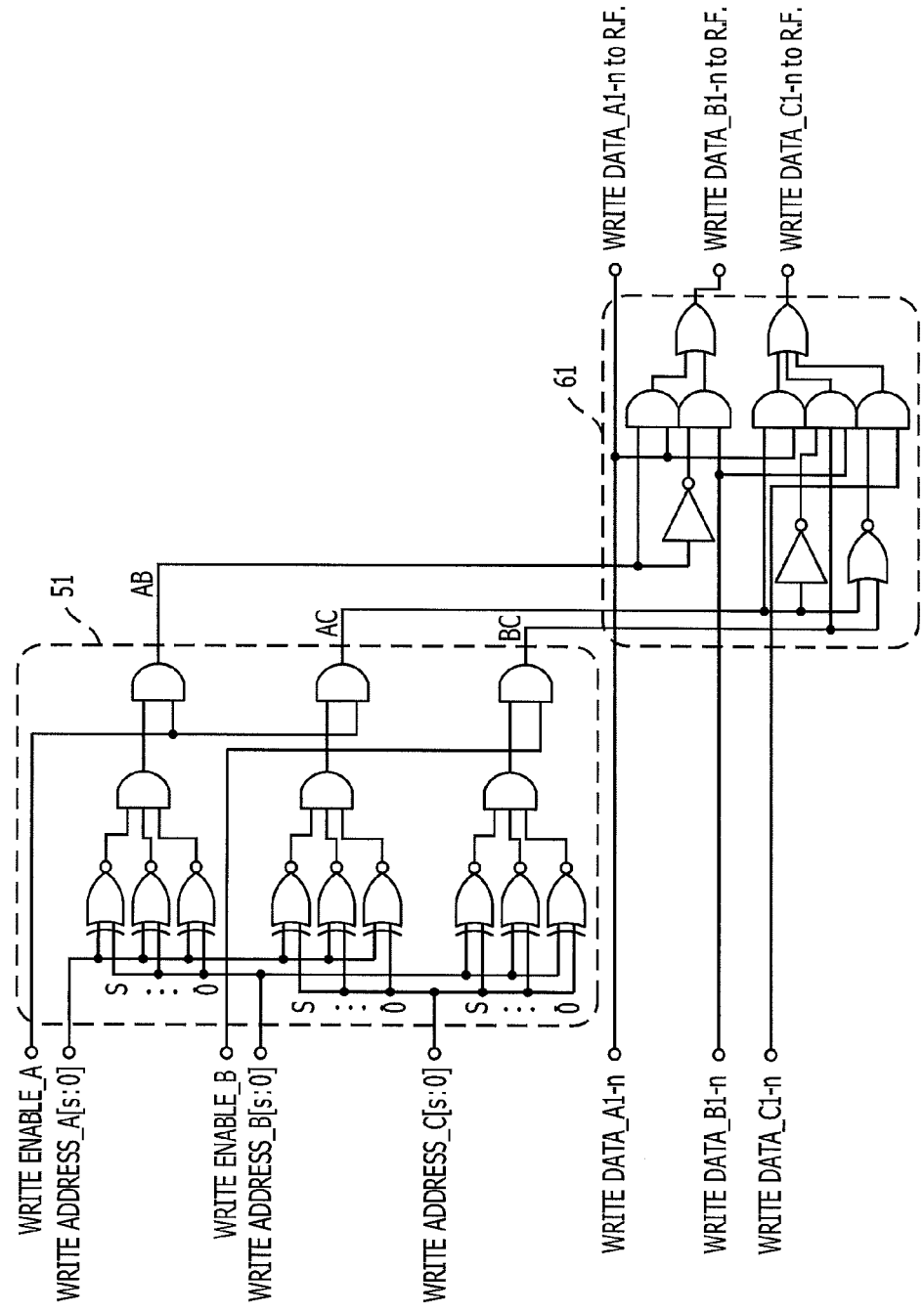
FIG. 7 is a diagram illustrating an address match detection circuit and a changing circuit.

FIG. 7 is a diagram illustrating the address match detection circuit 51 and the changing circuit 61. The address match detection circuit 51 and the changing circuit 61 in FIG. 7 are gate circuits and the details are omitted here, but the address match detection circuit 51 and the changing circuit 61 in FIG. 7 perform operations that are similar to the above-described operations. When "WriteAddress_A" and "WriteAddress_B" are valid and matched to each other, an output AB of the address match detection circuit 51 becomes "1", and the changing circuit 61 changes "WriteData_B1-n" to "WriteData_A1-n". When "WriteAddress_A" and "WriteAddress_C" are valid and matched to each other, an output AC of the address match detection circuit 51 becomes "1", and the changing circuit 61 changes "WriteData_C1-n" to "WriteData_A1-"n. When "WriteAddress_B" and "WriteAddress_C" are valid and matched to each other, an output BC of the address match detection circuit 51 becomes "1", and the changing circuit 61 changes "WriteData_C1-n" to "WriteData_B1-n". In addition, when "WriteAddress_A", "WriteAddress_B", and "WriteAddress_C" are matched to each other, the output AB, output AC, and output BC of the address match detection circuit 51 become "1", and the changing circuit 61 changes "WriteData_B1-n" and "WriteData_C1-n", to "WriteData_A1-n".

As described above, in the register file device according to the embodiment, when two or more of "WriteAddress_A" to "WriteAddress_C" are valid and the values are same, the corresponding pieces of write data are changed to the same value, so that bus fight does not occur, and a short circuit between data lines is not generated. In addition, the address match detection circuit 51 and the changing circuit 61 are not provided in a path in which the decoder decodes "WriteAddress" and "WriteEnable" to generate the write signals "WEA" to "WEC", so that delay due to delay critical path is not increased. In addition, the single address match detection circuit 51 and the single changing circuit 61 may be provided in the register file device, so that "increase in the footprint" is reduced.

Figure 8:
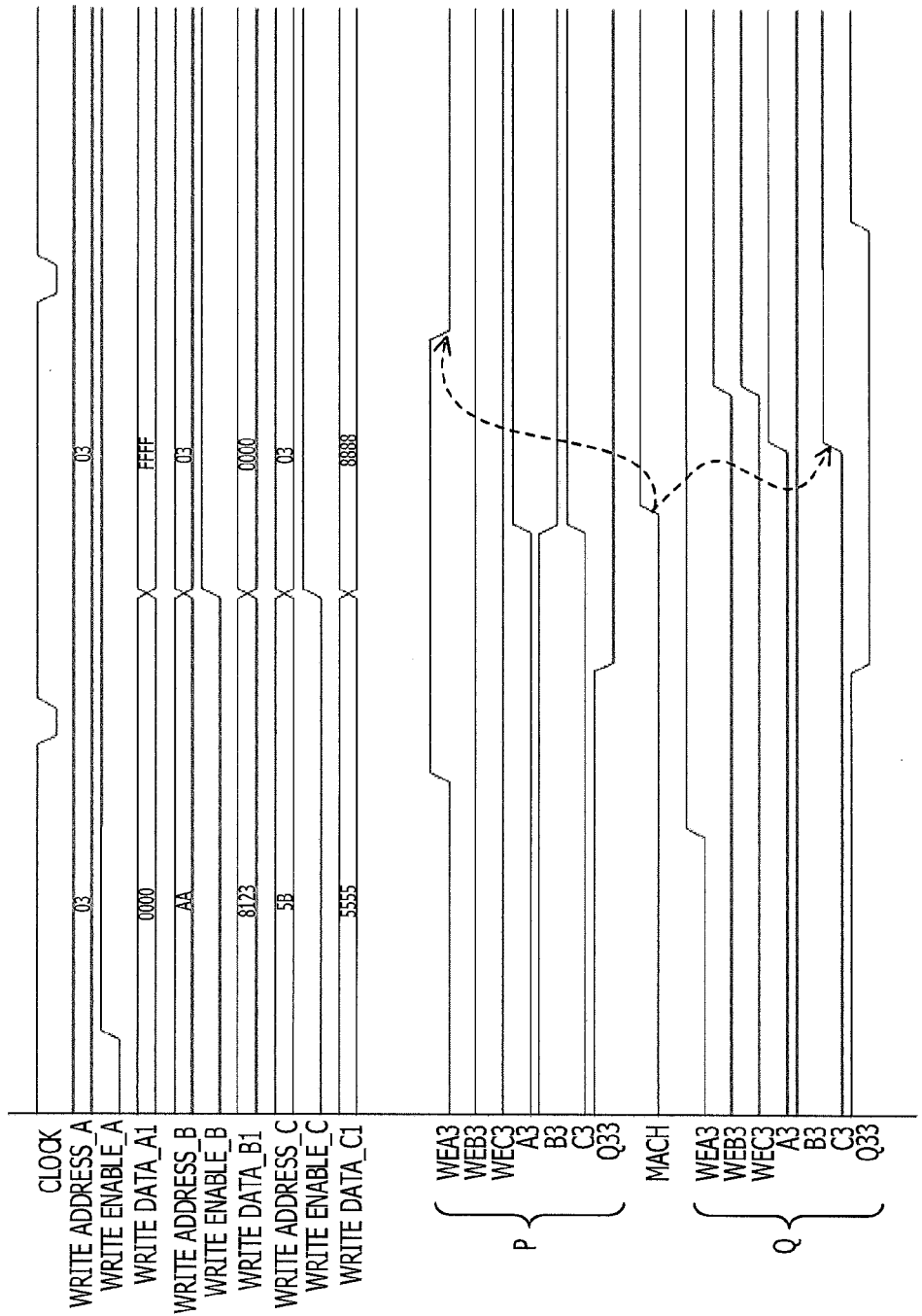
FIG. 8 is a time chart illustrating an operation of the register file device according to the embodiment.

FIG. 8 is a time chart illustrating an operation of the register file device according to the embodiment. In FIG. 8, for comparison, an operation of the register file device illustrated in FIGS. 3 and 4 in which the measures for avoiding bus fight are taken is also described. In FIG. 8, "P" illustrates the operation of the register file device illustrated in FIGS. 3 and 4, and "Q" illustrates the operation of the register file device according to the embodiment.

As illustrated in FIG. 8, "WriteAddress_A" to "WriteAddress_C" become "03" at the second Clock, and "WriteEnable_A" to "WriteEnable_C" also become "1 (High)", which is a condition of the occurrence of bus fight. "Match" between "P" and "Q" is changed to "1" when the address match detection circuit 51 in FIG. 4 and FIG. 5 detects that "WriteAddress_A" to "WriteAddress_C" are matched to each other. The priority adjustment circuits 411 to 41m in FIG. 3 also include a circuit that is similar to the address match detection circuit.

In the operation of the register file device in FIG. 3 and FIG. 4, which is illustrated by "P", "WEA3" to "WEC3" that are write signals of the third multi-port latch "Word_3" are set at "0" and writing to the storage element is stopped. In "P", "WEA3" to "WEC3" are changed to "0" after "Match" is changed to "High" and a time elapses.

In addition, in the register file device according to the embodiment, control of write signals is not performed, so that as illustrated by "Q", "WEA3" to "WEC3" remain at "1", writing to the third multi-port latch "Word_3" is performed. However, the data signals "A3" to "C3" to be written to the multi-port latch "Word_3" are caused to become the same signal (value "1" of "A3" in FIG. 8), so that the occurrence of bus fight in the storage element is suppressed.

When multi-hot occurs, the changing circuit 61 in FIG. 7 causes all corresponding pieces of write data to be matched to one of the pieces of write data (data A in FIG. 7), but any value may be applied as long as the values are same. For example, the all pieces of write data may become the data B or C, or "0 (Low)" or "1 (High)".

Figure 9:
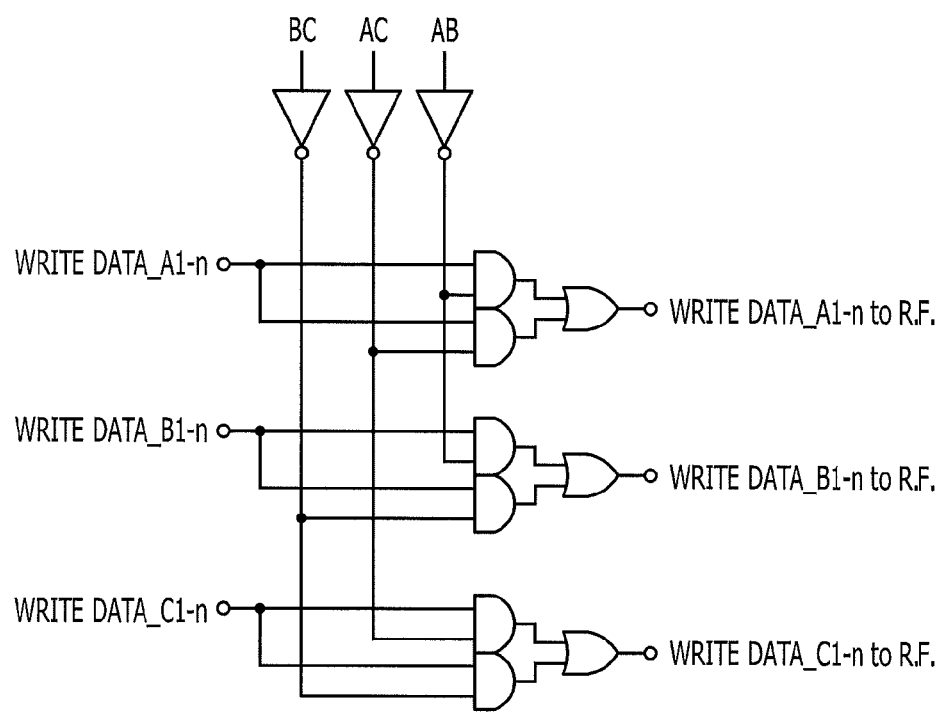
FIG. 9 is a diagram illustrating an example of the changing circuit by which all corresponding pieces of write data are caused to become 1 ("High") when multi-hot occurs.

FIG. 9 is a diagram illustrating an example of the changing circuit by which all corresponding pieces of write data are caused to become 1 ("High") when multi-hot occurs. The detailed description of the changing circuit is omitted.

As described above, in the register file device according to the embodiment, the occurrence of bus fight is avoided with a smaller circuit than that of FIG. 3, with the size of device, which is substantially the same as that of FIG. 4, and with high operation speed.

Figure 10:
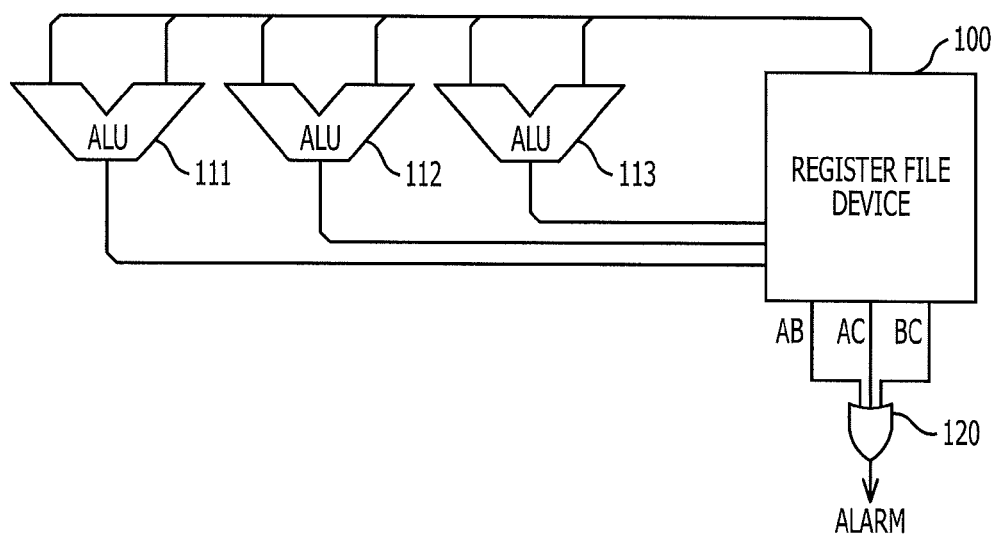
FIG. 10 is a diagram illustrating a structure of an arithmetic device in which the register file device according to the embodiment is used.

An example in which the register file device according to the embodiment is applied to an arithmetic device is described below. FIG. 10 is a diagram illustrating a structure of an arithmetic device in which the register file device according to the embodiment is used.

The arithmetic device includes three arithmetic units (ALU) 111 to 113, a single register file device 100, and a 3-input OR gate 120, and executes arithmetic processing in parallel in the three ALUs 111 to 113 in order to speed up the arithmetic processing. Operand data that is used in the three ALUs 111 to 113 is supplied from the register file device 100, and calculation result data is stored in the register file device 100. The calculation result data that is stored in the register file device 100 is mainly used in the three ALUs 111 to 113, and may be supplied to another ALU.

When multi-hot is detected, the address match detection circuit 51 of the register file device 100 changes one of the output AB, output AC, and output BC in FIG. 7 to "1 (High)". In response to the change, the 3-input OR gate 120 changes the output to "1 (High)" and issues an alarm. The occurrence of the alarm means that occurrence of multi-hot that does not occur during the normal operation and that some kind of an error occurs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A register file device comprising:
a multi-port latch; and
a write circuit that generates a signal to be written in the multi-port latch, the write circuit generating the signal on the basis of a plurality of data groups each including a write control signal, a write address, and a piece of write data, wherein
the write circuit includes:
a detection circuit that detects at least two write control signals occurred simultaneously among write control signals, and
a changing circuit that changes write data corresponding to one of the write control signal which is to be written to the multi-port latch to become same as write data corresponding to another of the write control signal.

2. The register file device according to claim 1, wherein the detection circuit outputs an address match signal when detecting a simultaneous writing to at least two ports of a multi-port latch.

3. The register file device according to claim 2, wherein the detection circuit outputs an alarm in response to the address match signal.

4. A register file device comprising:
a multi-port latch; and
a write circuit that generates a signal to be written in the multi-port latch, the write circuit generating the signal on the basis of a plurality of data groups each including a write address, and write data,
wherein the write circuit includes:
a detection circuit that outputs an address match signal when a first write address of one of the plurality of data groups is equal to a second write address of the other of the plurality of data groups, and
a changing circuit that changes write data corresponding to the second write address which is to be written to the multi-port latch to write data corresponding to the first write address.

5. A method of preventing a bus fight by a processor, the processor accessing a memory and performing a process comprising:
detecting a simultaneous writing to at least two ports of a multi-port latch;
changing write data to be written to one of the port to become same as write data to be written to another of the port; and
writing the changed write data to the one of the port and writing the write data to the another of the port.

6. The method according to claim 5, comprising further:
outputting an address match signal when detecting a simultaneous writing to at least two ports of a multi-port latch.

7. The method according to claim 6, comprising further:
outputting an alarm in response to the address match signal.

* * * * *